United States Patent [19]

Maeda et al.

[11] Patent Number: 5,902,103
[45] Date of Patent: May 11, 1999

[54] VERTICAL FURNACE OF A SEMICONDUCTOR MANUFACTURING APPARATUS AND A BOAT COVER THEREOF

[75] Inventors: Kiyohiko Maeda; Satoshi Kakizaki; Tomoshi Taniyama; Hidehiro Yanagawa; Ken-ichi Suzuki, all of Tokyo, Japan

[73] Assignee: Kokusai Electric Co., Ltd., Tokyo, Japan

[21] Appl. No.: 08/771,976

[22] Filed: Dec. 23, 1996

[51] Int. Cl.⁶ ........................................ F27D 5/00
[52] U.S. Cl. .................... 432/253; 432/241; 432/152; 432/258
[58] Field of Search ...................... 432/241, 5, 6, 432/11, 152, 253, 258; 392/416, 418; 219/390, 405, 411; 118/724, 725, 50.1

[56] References Cited

U.S. PATENT DOCUMENTS

| | | | |
|---|---|---|---|
| 5,447,294 | 9/1995 | Sakata et al. | 432/5 |
| 5,458,685 | 10/1995 | Hasebe et al. | 118/724 |
| 5,556,275 | 9/1996 | Sakata et al. | 432/241 |

FOREIGN PATENT DOCUMENTS

| | | |
|---|---|---|
| 63-136529 | 6/1988 | Japan . |
| 3-22522 | 1/1991 | Japan . |
| 4-114560 | 10/1992 | Japan . |
| 5-55544 | 7/1993 | Japan . |
| 5-55545 | 7/1993 | Japan . |

*Primary Examiner*—Teresa Walberg
*Assistant Examiner*—Jiping Lu
*Attorney, Agent, or Firm*—Nields, Lemack & Dingman

[57] ABSTRACT

A vertical furnace for use in a semiconductor manufacturing apparatus, which comprises a heater, an outer tube, an inner tube, all being disposed concentrically in a multi-layered fashion, a boat adapted to be introduced into the inner tube with a wafer loaded thereon, and a boat cover disposed internally of the inner tube concentrically therewith. The boat cover is comprised of a boat cover body and an auxiliary cover plate connected to said boat cover body with a given gap therebetween, the boat cover body having a predetermined number of slit apertures extending in a generator direction thereof, the auxiliary cover plate being disposed to cover the slit apertures. The introduced reactive gas flows in branched streams, one flowing through the inside of the boat cover and the other flowing in past the boat cover, whereby the film deposited on the wafer is improved in uniformity and homogeneity. Further, since the boat cover is provided on the inner tube in the form of a unitary body, adjustments relative thereto can be made easily, thus improving the efficiency of the maintenance works thereof.

7 Claims, 14 Drawing Sheets

VERTICAL FURNACE OF A SEMICONDUCTOR MANUFACTURING APPARATUS AND A BOAT COVER THEREOF

TECHNICAL BACKGROUND

The present invention relate generally to a semiconductor manufacturing apparatus and, in particular, to a semiconductor manufacturing apparatus having a vertical furnace and a boat cover thereof.

Semiconductor devices are manufactured through processes such as depositing thin films on surfaces of silicon wafers and etching the latter. Such thin film deposition and etching are carried out in a semiconductor manufacturing apparatus having a vertical furnace.

In recent years, the degree of integration of integrated circuits as in semiconductor devices has been increasing. This caused the relevant processing or working to be more fine and precise. The increased integration requires the thin film deposition in the semiconductor manufacturing apparatus to be performed such that the resulting semiconductor devices have improved uniformity in film thickness and homogeneity.

In the vertical furnace, a multitude of wafers, that is, substrates to be processed, are subjected to a required treatment while they are retained horizontally by means of a boat. The boat is covered by a boat cover so as to improve the uniformity in thickness of the film deposited on the wafers.

Reference is made to FIGS. 13 and 14 hereof in which a conventional semiconductor manufacturing apparatus is shown.

In these figures, reference numeral 1 designates an outer tube with a closed upper end. The outer tube 1 includes a short tubular flange 2 airtightly connected to a lower end thereof. An inner tube 3 with upper and lower opened ends is supported by the flange 2 and disposed internally of the outer tube 1 concentrically therewith. An introducing nozzle 6 communicates with the flange 2 for introducing a reactive gas into the outer tube 1. An exhaust nozzle 7 communicates with a gap defined between the outer tube 1 of the flange 2 and inner tube 3. Extend around the outer tube 1 is a heater 4.

Lower end of the flange 2 is airtightly covered by a seal cap 5, on which a cover boat 10 is vertically disposed. The cover boat 10 serves as a boat for retaining wafers horizontally in a multi-storied fashion and forms part of a boat cover tube 8 to be described below. The cover boat 10 has a lower base 17, a support post 11 and a cover plate 12. The post 11 is disposed vertically on the lower base 17 and has horizontally extending grooves or recesses for retaining wafers. The cover plate 12 is disposed vertically and takes the form of a semicircle so as to provide a slit gap 18. The wafers are loaded on the cover boat 10 and introduced into the inner tube 3 for required processing.

For processing the wafers, the inside of the furnace is heated by the heater 4, followed by introducing a reactive gas by means of the introducing nozzle 6 and exhausting through the exhaust nozzle 7. The introduced reactive gas is decomposed by heating and deposited as thin films through reaction with the wafer surfaces. Upon deposition of these thin films, the flow of the reactive gas imparts a significant influence on the quality of the thin film deposition, e.g., uniformity of the thin films. Consequently, it is necessary for all wafers to be fed with a uniform reactive gas stream.

To cope with such problem, the conventional vertical furnace has the above-mentioned boat cover tube 8 with the slits 18.

Boat cover tube 8 is divided into left and right halves by a boat cover 9 and a cover boat 10. The boat cover 9 has an upper base 15 with a central aperture 16. The upper base 15 is provided with the cover plate 12 having an arc-shaped cross section and a vertical length which is substantially equal to the height of the boat. Between adjacent cover plates 12, 12, there is provided a slit gap 18 extending vertically. Auxiliary cover plate 14 having the same width as that of the slit gap 18 is provided in an opposed relation to the slit gap 18 by means of pieces 13. Between the auxiliary cover plate 14 and the cover plate 12, there is provided a predetermined clearance or gap extending radially. A semi-cylindrical cover is thus provided by the cover plate 12 and the auxiliary cover plate 14.

The boat cover 9 is introduced into the inner tube 3. The upper base 15 is loaded onto the upper end of the inner tube 3, whereby the boat cover 9 is retained by the inner tube 3.

The cover boat 10 has substantially the same arrangement as that of the boat cover 9. The lower base 17 has a support post 11 disposed vertically thereon. On the post 11, there is provided a cover plate 12 having a arc-shaped cross section and a vertical length substantially equal to the boat height in such a manner as to provide a vertical gap 18 in the form of a slit. An auxiliary cover plate 14 of the same width as the slit gap 18 is disposed in opposed relations to the slit gap 18. A given gap is provided between the auxiliary cover plate 14 and the cover plate 12. The cover boat 10 is disposed vertically on the seal cap 5. The post 11 has a plurality of grooves or recesses (not shown) disposed at a predetermined pitch, which is designed for retaining the wafers in a horizontally oriented fashion.

Boat cover 9 is disposed within the inner cover 3 and the cover boat 10 can be inserted into and taken out from the inner tube 3 with the wafers loaded thereon. When the cover boat 10 with the wafers loaded thereon is introduced into the furnace, that is, the inner tube 3, the boat cover tube 8 of cylindrical configuration is defined by the boat cover 9 and cover boat 10, whereby the wafers (not shown) are enclosed by the boat cover tube 8.

Reactive gas fed from the introducing nozzle 6 flows into the inner tube 3 and rises between the inner tube 3 and the boat cover tube 8. While rising, the reactive gas passes through a gap between the auxiliary cover plate 14 and the cover plate 12 and through the slit gap 18 and flows into the boat cover tube 8 (see FIG. 14) and around the circumferential portions of the wafers. The gas rises further and flows out through the aperture 16. It then descends between the outer tube 1 and inner tube 3 and is exhausted through the exhaust nozzle 7.

By provision of the boat cover tube 8, the reactive gas flows between the boat cover tube 8 and inner tube 3 and through the inside of the boat cover tube 8, and is then diffused at the slit gap 18. Thereafter, it flows into the boat cover tube 8, whereby the wafers are rendered to have thin films of improved uniformity in thickness at the circumferential and central portions thereof. The auxiliary cover plate 14 is an obstructive plate for obstructing the flow of the reactive gas from the slit gap 18 directly into the boat cover tube 8 to thereby achieve effective diffusion of the reactive gas.

Another method for improving the uniformity in thickness and homogeneity of thin films deposited on wafers is known wherein a gap between a tubular member enclosing the wafers and the peripheral edges of the wafers is reduced.

Reference is now made to FIGS. 15 and 16 hereof wherein an example of such semiconductor manufacturing apparatus without the cover boat tubular member 8 is shown. In this apparatus, a gap between the tubular member enclosing the wafers and the peripheral edges of the wafers is reduced to improve the uniformity in thickness and homogeneity of thin films deposited on the wafers.

In FIGS. 15 and 16, the same reference numerals are used for portions which are also shown in FIGS. 13 and 14.

The outer tube 1 has a lower end to which a flange 2 in the form of a short tube is airtightly connected. An inner tube 3 supported by the flange 2 and having upper and lower opened ends is disposed within the outer tube 1 concentrically therewith. An introducing nozzle 6 communicates with the flange 2 for introducing a reactive gas into the outer tube 1. An exhaust nozzle 7 is provided to communicate with a gap between the outer tube 1 of the flange 2 and the inner tube 3. Around the outer tube 1, there is provided a heater 4. A boat 19 is vertically disposed on a seal cap 5 covering the lower end of the flange 2 airtightly. The boat 19 is designed to horizontally retain wafers in a multi-storied fashion. The wafers 32 are loaded on the boat and are fed into the inner tube 3 for a required treatment.

In the example apparatus, the inner tube 3 is provided with an escape portion 3a so as to reduce the gap "t" between the tubular member or the inner tube 3 and the peripheries of the wafers. By providing the escape portion 3a, the interference between the inner tube 3 and a support post 19a of the boat 19 can be avoided, whereby the reduction of the gap "t" is enabled and the uniformity in thickness and homogeneity of the thin films are improved.

Thickness of the thin films deposited on the wafers is highly influenced by the flow of the reactive gas. Thus, the wafers are enclosed by the boat cover tube as in the prior apparatus shown in FIGS. 13 and 14. However, in the above-mentioned example apparatus, a problem is still experienced such that the film thickness adjacent to the slit gap is liable to become large or small. Thus, it is required to improve the uniformity in film thickness in the vicinity of the slit gap.

There is also a demand that the number of wafers which can be treated at one time be increased to enhance the productivity of a semiconductor manufacturing apparatus. A semiconductor manufacturing apparatus in which wafers are treated in its vertical furnace experiences a height restriction that is up to the height of the ceiling of a clean room. Thus, it is not possible to make the boat or vertical furnace unconditionally high. This requires the wafers supported on the boat to be positioned at a small pitch but it is known that by making the pitch between the wafers small, the film thickness around the slit gap is liable to become irregular.

Further, when film deposition process is carried out, reaction by-products stick to a reaction chamber. Before long, the reaction by-products come off in the form of particles and stick to the wafers and contaminate the latter, thus deteriorating the treatment quality. It is therefore necessary to clean the outer tube 1 and inner tube 3 forming the reaction chamber periodically or after a predetermined period of operation time.

Moreover, where the boat cover tube is provided to improve the quality of thin films to be deposited on wafers as described above, the inside arrangement of the furnace becomes complex, thus necessitating a prolonged time for cleaning. This further leads to the problem that the semiconductor manufacturing apparatus needs to be interrupted for a longer time period, deteriorating the production efficiency of the semiconductor manufacturing apparatus.

In the separate conventional apparatus shown in FIGS. 15 and 16, the uniformity in film thickness and homogeneity is improved without the use of the boat cover tube. However, since the reactive gas is arranged to flow upwardly from below within the inner tube 3 and the gap "t" between the peripheries of the wafers and the inner surface of the inner tube 3 is small, the exhaust conductance relative to the gas exhaust is large, thus producing a pressure difference between upper and lower portion of the reaction chamber. Pressure of the reactive gas is an important film deposition condition determining factor. Thus, it becomes necessary to provide a temperature gradient of 50° C. between the upper and lower portions of the reaction chamber. The temperature difference influences the quality of the deposited films and hence is undesirable in terms of the uniformity of the thin films.

SUMMARY OF THE INVENTION

It is a first object of the present invention to provide a semiconductor manufacturing apparatus having the boat cover tube, which is adapted to improve the uniformity in thickness of thin films deposited around a slit gap and to keep the film quality uniform by suppressing the increase of exhaust conductance to thereby prevent a temperature difference from arising during a wafer treatment within the reaction chamber. Another object of the present invention is to render a cleaning operation easy with respect to a reaction furnace including a boat cover tube to thereby improve the operation efficiency of the semiconductor manufacturing apparatus and hence the throughput.

To attain the foregoing objects, in one aspect of the present invention, there is provides a vertical furnace for use in a semiconductor manufacturing apparatus, comprising: a heater, an outer tube, an inner tube, all being disposed concentrically in a multi-layered fashion; a boat adapted to be introduced into the inner tube with a wafer loaded thereon, and a boat cover disposed internally of the inner tube concentrically therewith.

In a preferred form, the boat cover comprises a boat cover body and auxiliary cover plates spaced apart by a given gap from the boat cover body, and the boat cover body has a given number of slit apertures extending in a generator direction thereof, the auxiliary cover plate being disposed to cover the slit apertures to thereby provide a gas flow passage between the auxiliary cover plate and the boat cover body.

With this arrangement, it becomes possible to effectively reduce the amount of gas turned into a labile state between the inner tube and the boat cover, flowing in through gas flow apertures of the boat cover.

Preferably, the boat cover has a tubular configuration. This arrangement provides an advantage over a separable boat cover in that relative positioning is unnecessary, resulting in increased efficiency in installation operations of the boat cover.

Desirably, the boat cover is designed to be separable into semi-cylindrical halves. The boat has support posts for supporting wafers and the boat cover has escape portions provided at portions thereof corresponding to the support posts of the boat for accommodating the support posts. These arrangements enables reduction of the distance from the wafer edges to the boat cover wall, even at locations where the boat post interferes or presents a bar.

The distance from an edge of the wafer to the boat cover may be set at $\frac{1}{3}$ to $\frac{2}{3}$ of a vertical distance between adjacent two wafers. Where the wafer-to-wafer distance is short, it is necessary to shorten the distance from the wafer edges to the boat cover wall. The distance of ⅓ to ⅔ of the wafer-to-wafer distance provides the most desirable wafer treatment condition.

It is preferred that the inner tube and the boat cover are opened at upper and lower ends thereof. The apparatus may thus go without a member at an upper end thereof which bars the gas flow, and the conductance can be increased compared to a boat separable into two pieces. It further becomes possible to reduce the pressure difference between the upper and lower parts and the difference between the values of temperature set at the upper and lower parts of the boat.

The boat is mounted in such manner that a ceiling plate is connected to a bottom plate by means of support posts having a wafer support groove, the ceiling plate having a dimension smaller than a diameter of the wafer. Since the ceiling plate of the boat may also impart an influence upon the exhaust conductance, it has a dimension smaller than the wafers so that such influence can be reduced.

Desirably, an upper flange is connected to a lower end of the outer tube while a lower flange is connected to the upper flange. The inner tube is supported by the upper flange while the boat cover is supported by the lower flange. Since the inner tube and the boat cover can be mounted independently, their mounting operations are rendered easy. At the same time, their positioning relative to the inner tube becomes easy.

In an alternative form, an upper flange is connected to a lower end of the outer tube while an intermediate flange is connected to a lower end of the upper flange. A lower flange may be connected to a lower end of the intermediate flange. The inner tube is supported by the intermediate flange while the boat cover is supported by the lower flange.

In a further alternative form, an upper flange is connected to a lower end of the outer tube, a lower flange is connected to the upper flange, the inner tube is supported by the lower flange, the inner tube has at an upper end thereof one of boat cover halves of semi-cylindrical shape suspended therefrom, and the other of the semi-cylindrically shaped boat cover halves is secured to the boat disposed on a seal cap.

These arrangements enable mounting of the inner tube without the use of special jigs, thus rendering the relevant assembling operations easy.

According to another aspect of the present invention, there is provided a boat cover which comprises a boat cover body and an auxiliary cover plate connected to the boat cover body with a given gap therebetween, the boat cover body having a predetermined number of slit apertures extending in a generator direction thereof, the auxiliary cover plate being disposed to cover the slit apertures to thereby provide a gas flow passage between the auxiliary cover plate and the boat cover body.

Preferably, the boat cover has a tubular configuration.

The boat cover may be designed to be separable into semi-cylindrical halves.

In a preferred form, the boat cover has an escape portion at portions thereof corresponding to the support posts of the boat for accommodating the support post.

DETAILED DESCRIPTION OF THE PREFERRED EMBODIMENTS

Embodiments of the present invention will be described below with reference to the accompanying drawings.

Figure 1:
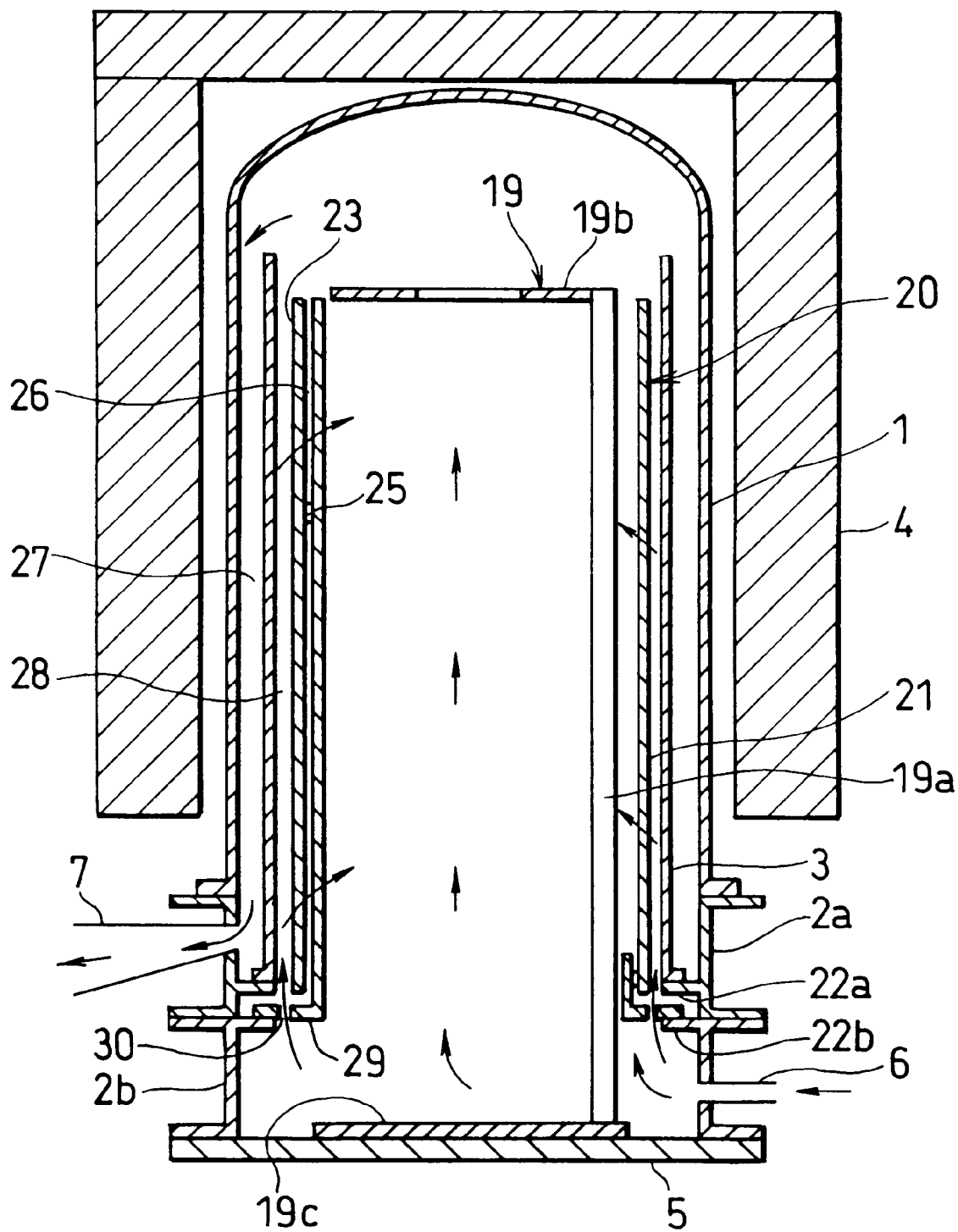
FIG. 1 is a vertical cross-sectional view schematically showing an embodiment according to the present invention.
Figure 2:
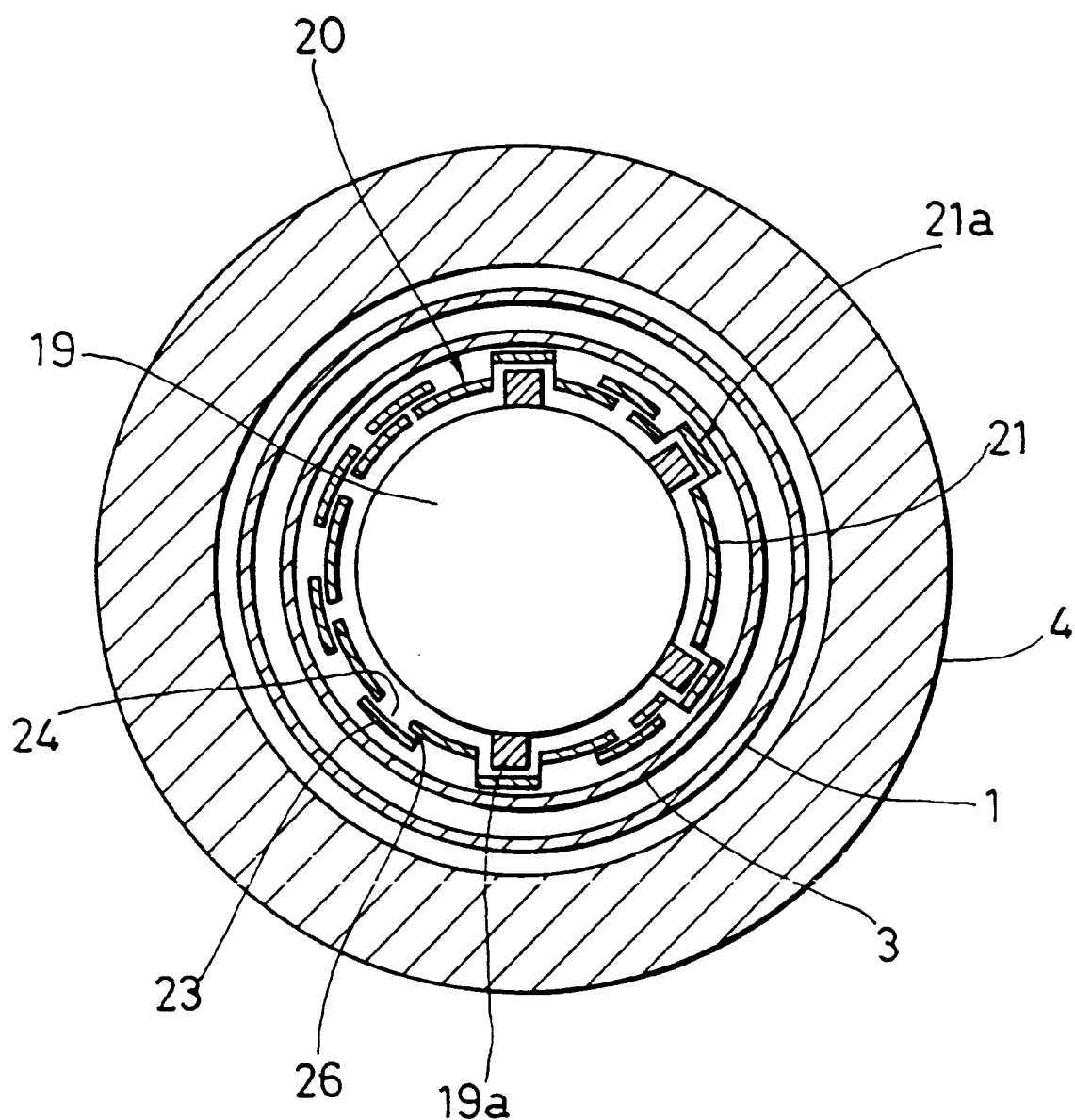
FIG. 2 is a schematic top plan view of the embodiment of FIG. 1.
Figure 3:
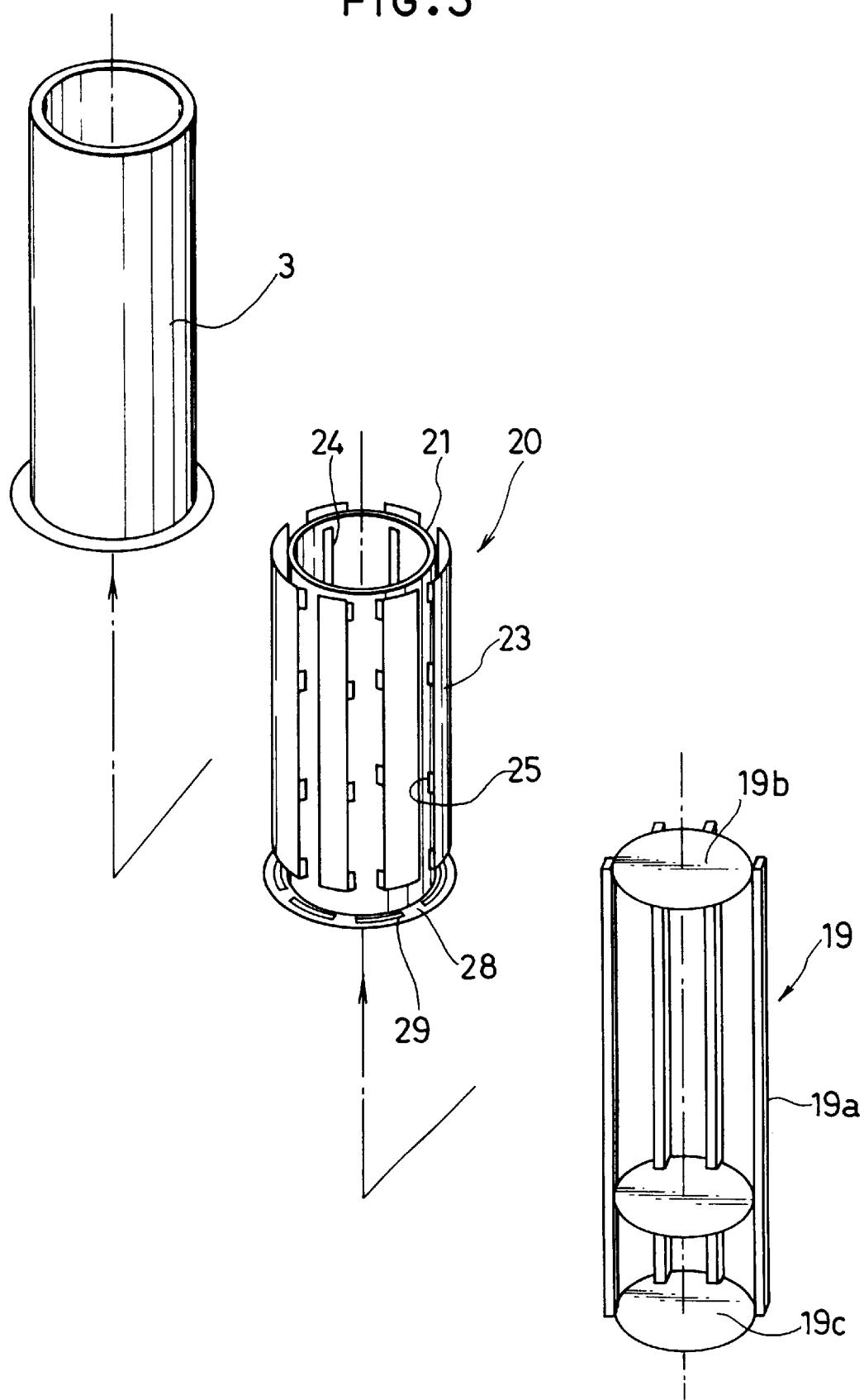
FIG. 3 is an exploded perspective view illustrating principal portions of the embodiment.
Figure 13:
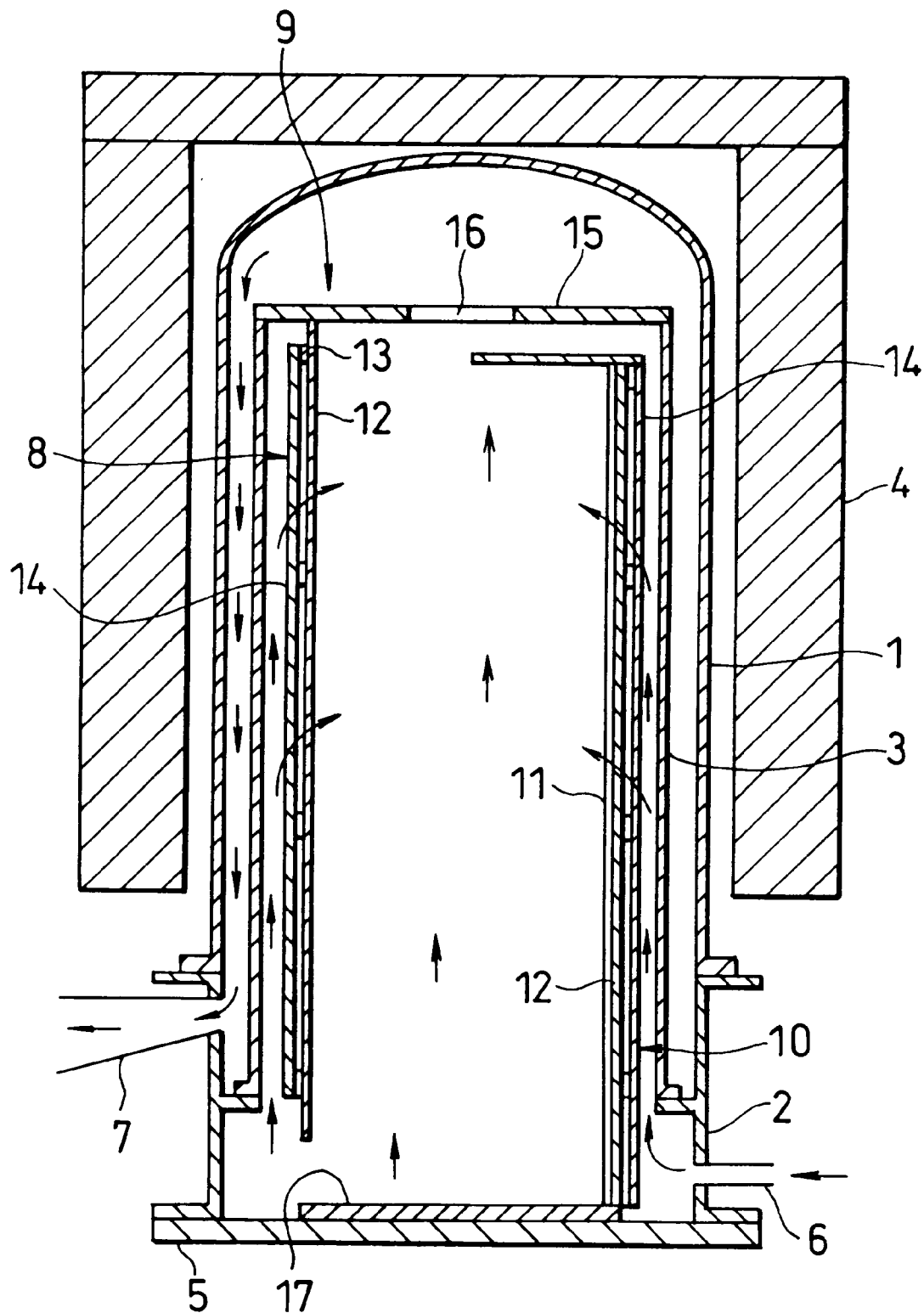
FIG. 13 is a vertical cross-sectional view schematically illustrating a conventional semiconductor manufacturing apparatus.
Figure 14:
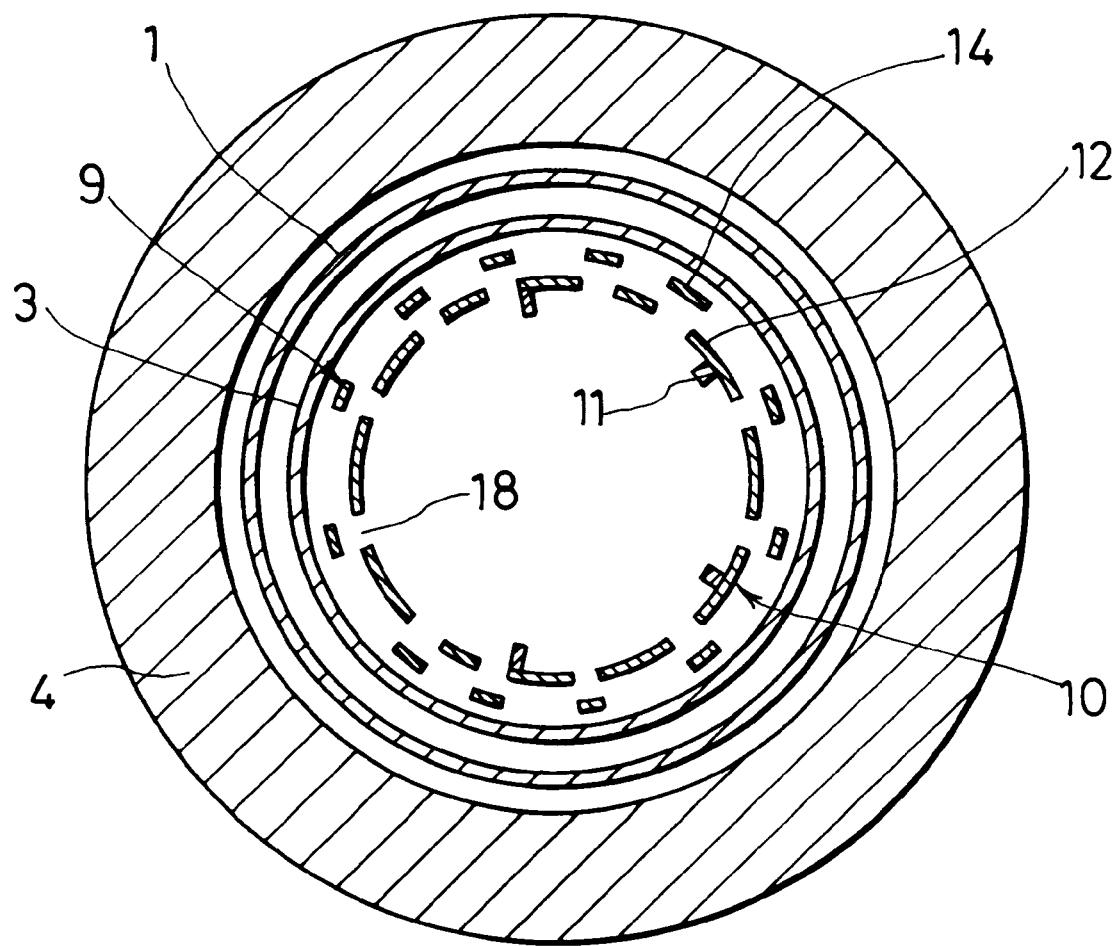
FIG. 14 is a schematic top plan view of the conventional apparatus.
Figure 15:
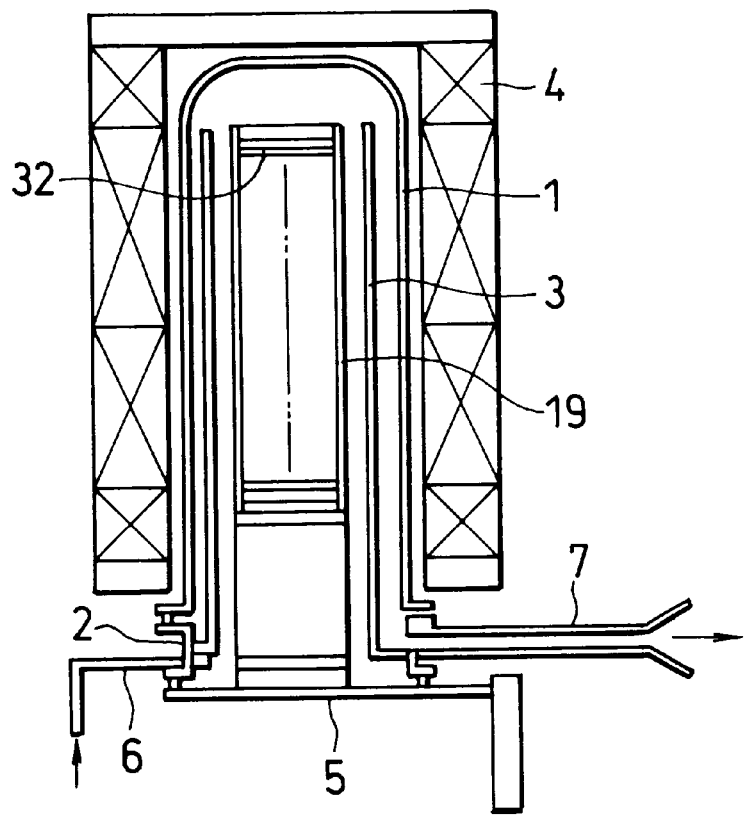
FIG. 15 is a vertical cross-sectional view schematically showing a separate conventional semiconductor manufacturing apparatus.
Figure 16:
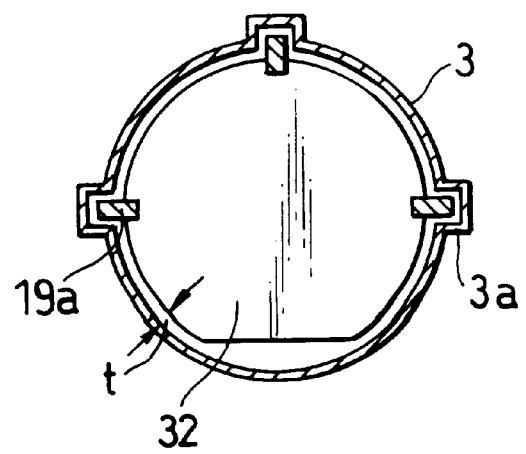
FIG. 16 is a schematic top plan view of the separate conventional apparatus.

In FIG. 1 to FIG. 3, the same reference numerals will be used for parts and elements shown in FIG. 13 and FIG. 14, and their discussion will be omitted.

A flange mounted on a seal cap 5 can be separated into two halves and is composed of an upper flange 2a and a lower half 2b, as shown in FIG. 1. Inside the upper flange 2a, there is provided an inner brim 22a on which an inner tube 3 is disposed vertically. The lower flange 2b has an inner brim 22b at an upper end thereof. On the inner brim 22b, a boat cover 20 is vertically disposed. The inner tube 3 defines with an outer tube 1 a cylindrical space 27 therebetween. Another space 28 is defined between the inner tube 3 and boat cover 20. Discussion will next be made as to the boat cover 20.

A cylindrical member 21 is disposed concentrically with the inner tube 3 and has a plurality of slit apertures 24 (FIGS. 2 and 3) disposed at predetermined intervals in a circumferential direction of the cylindrical member 21 and extending in a generator direction of the cylindrical member 21. Auxiliary cover plates 23 are connected to the cylindrical member 21 by means of blocks or pieces 25 such that they cover the slit apertures 24. Each auxiliary cover plate 23 is wider than the widths of the slit apertures 24. Thus, both long edges of the auxiliary cover plates 23 are positioned above the cylindrical member 21 in an overlapping relation therewith to thereby provide a gas flow passage 26 between the auxiliary cover plates 23 and the cylindrical member 21.

Within the cylindrical member 21, a boat 19 is disposed vertically. The boat 19 is composed of a ceiling plate 19b, a bottom plate 19c and support or brace posts 19a connecting the plates 19c, 19c. The support posts 19a has grooves (not shown) provided at a predetermined pitch, by which grooves wafers are retained. Part of the support posts 19a of the boat 19 projects outwardly from ceiling plate 19b.

Cylindrical member 21 is provided with an escape portion 21a (FIG. 2) recessed or retreated so as to prevent the interference between the support posts 19a and the cylindrical member 21. The cylindrical member 21 is provided at a lower end thereof with a flange 29 having a plurality of arc-shaped elongate apertures 30 disposed on the same circumference at a predetermined pitch. An introducing nozzle 6 is provided in communication with the lower flange 2b for introducing a reactive gas. An exhaust nozzle 7 communicates with the upper flange 2a.

Reactive gas is supplied from the introducing nozzle 6. Part of the gas flown in from the introducing nozzle 6 moves upward through the inside of the boat cover 20 while the remainder of the gas flows through the arc-shaped elongate apertures 30 to the space 28 and then goes up therethrough. During the upward movement of the gas through the space 28, the gas also flows between the boat cover 20 and the inner tube 3, through the reactive gas flow passage 26 and slit apertures 24, into the boat cover 20. Flow of the reactive gas from the slit apertures 24 into the boat cover 20 serves to supplement the gas concentration decreased due to the reactive gas moving upward through the boat cover 20. The reactive gas flowing through the arc-shaped elongate apertures 30 is directed in a circumferential direction as it passes through the reactive gas flow passage 26 formed between the auxiliary cover plates 23 and the cylindrical member 21. The gas flowing through the slit apertures 24 is diffused by interference of the opposed gas flow from the long edges of the auxiliary cover plates 23. The local gas concentration in areas adjacent to or around the slit apertures 24 is thus prevented from becoming high.

By the flow of the reactive gas moving upwardly through the boat cover 20 combined with the flowing gas diffused by the slit apertures 24, uniformity of the films deposited on wafers is improved. The reactive gas moved upward within the boat cover 20 makes a turn at the upper end of the inner tube 3, flows down through the space 27 between the outer tube 1 and the inner tube 3, and is then exhausted through the exhaust nozzle 7.

When a reactive gas for thin film deposition, e.g., a mixed gas of $SiH_4$ gas and $N_2O$ gas, or $SiH_4$ gas and $PH_3$, is introduced through the introducing nozzle 6, the reactive gas or the mixed gas turns into a labile gas state capable of readily undergoing a film depositing reaction with respect to a member heated over a predetermined temperature by the heat of the heater 4. The larger the space becomes, the more the labile gas increases. Now, discussion is made as to when the gas turned into a labile state between the inner tube 3 and boat cover 20 passes through the slit apertures 24 and is diffused toward wafers. The labile gas deposits as a thin film on the cylindrical member 21 and the auxiliary cover plates 23. Since the reactive gas flow passage 26 is formed between the cylindrical member 21 and the cover plates 23, the labile gas may not enter into the boat cover 20 directly. Thus, by regulating the shape or configuration of the reactive gas flow passage 26, the labile gas can be nicely removed. After it passed through the slit apertures 24, the inert gas is diffused, turns into a labile state during the course of diffusion, and deposits on the wafers in the form of thin films.

Diffusion of the gas passed through the slit apertures 24 will be discussed in more detail. Depending on the size of the space, the diffused gas varies in amount turning into a labile state. If the distance from the wafer edges to the boat cover 20 is too short, the space around the wafers becomes too small, whereby less labile gas will be around the edges of the wafers and hence the wafers will have thinner films at their edges. By contrast, if such distance is too long, the space around the wafers becomes large, whereby more labile gas will be around the edges of the wafers and hence the wafers will have thicker films at the edges thereof. Accordingly, the distance from the wafer edges to the boat cover 20 is preferably set so that the wafers are circumferentially positioned equidistantly from the boat cover 20, most preferably set at $\frac{1}{3}$–$\frac{2}{3}$, preferably $\frac{1}{2}$, of the loaded wafer-to-wafer space.

As explained above, the boat 19 has the support posts 19a. Notwithstanding the existence of such support posts 19a, the distance between the wafers and the boat cover 20 is required to be fixed at a desired value. For this reason, the escape portion 21a is provided. By providing the escape portion 21a, the support posts 19a may be received in the escape portion 21a, thus regulating the distance between the peripheral edges of the wafers and the boat cover 20.

The distance between the wafer edges and the boat cover 20 can be reduced up to a desired value. Increase in the exhaust conductance can be suppressed significantly by the reactive gas flowing in from the slit apertures 24. As a result, it becomes possible to suppress a pressure difference likely to arise between the upper and lower parts of the reaction chamber, thus negating the necessity for a temperature difference upon treatment in the reaction chamber and rendering the quality of the deposited films stable.

In the above-described embodiment, when a boat capable of loading a hundred of eight-inch wafers is employed, it becomes necessary for the post to have a larger cross-section in order to give a high-strength. Where a radial dimension of the post is 17 mm, the grooves of the post have a depth of 9 mm while a remaining portion of the post has a thickness of 8 mm. Where the wafers are arranged at a pitch of 8.6 mm, the distance from the wafer edges to the boat cover 20 is 2.8 mm–5.8 mm. Thus, the boat cover 20 should be provided with the escape portion 21a so as to escape from the post by 2.2 mm–5.2 mm.

In the present embodiment, the boat cover 20 is formed as a unitary body and fixedly secured with respect to the outer tube 1. Thus, mounting of the boat cover 20 may be effected such that the boat cover 20 is positioned concentrically with the inner tube 3, etc. Also, positional adjustments of the boat 19 may be performed based on the fixture as a reference on the furnace side such as the inner tube 3. Since the positional adjustments relative to the boat cover and boat are thus simple and the latter members are provided on the fixture side, those members may not encounter bit-by-bit or gradual positional displacement during the operations thereof as time elapses. Additionally, mounting and releasing of the boat cover 20 can be performed easily by engagement and disengagement of the lower flange 2b relative to the upper flange 2a. As a result, assembling and disassembling of the boat cover 20 is rendered easy, thus rendering the maintenance works such as cleaning easy and hence reducing the overall time required for cleaning.

Figure 4:
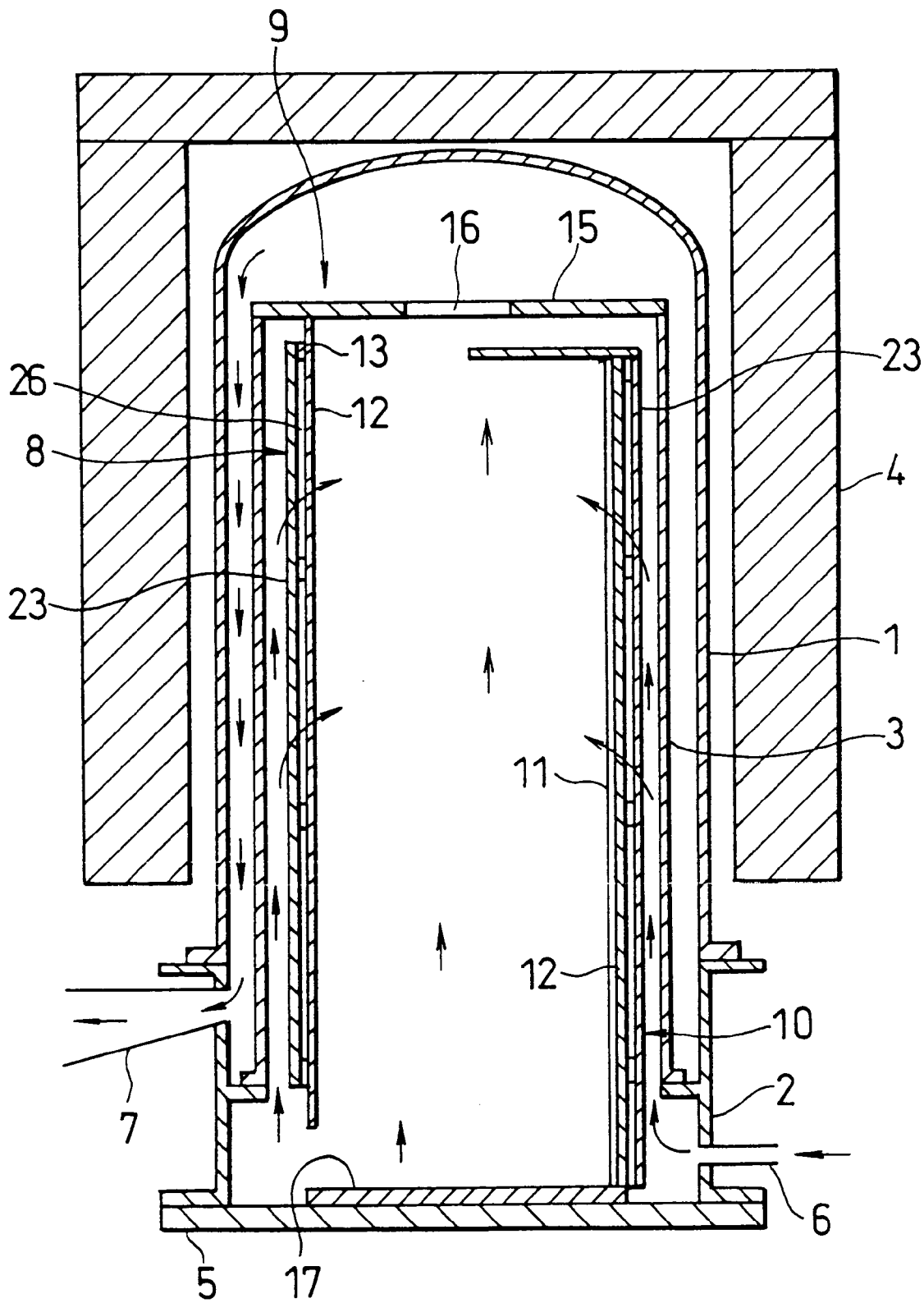
FIG. 4 is a vertical cross-sectional view schematically illustrating a separate embodiment according to the present invention.
Figure 5:
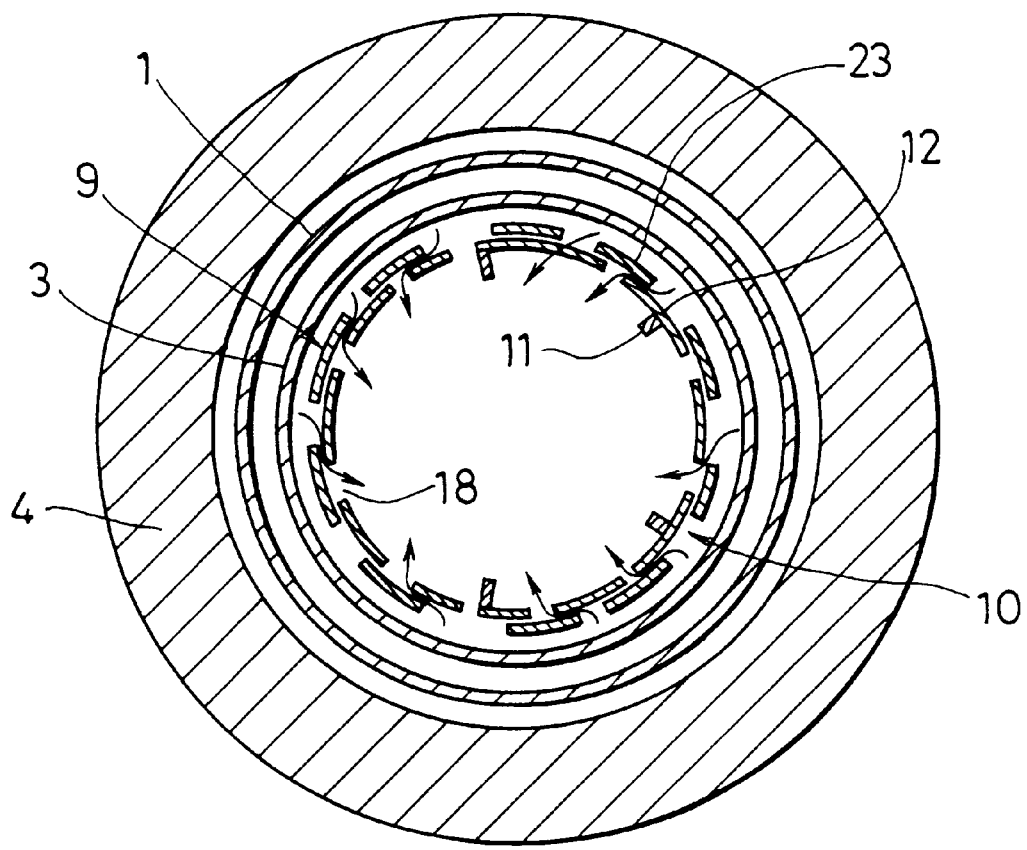
FIG. 5 is a schematic top plan view of the separate embodiment.
Figure 6:
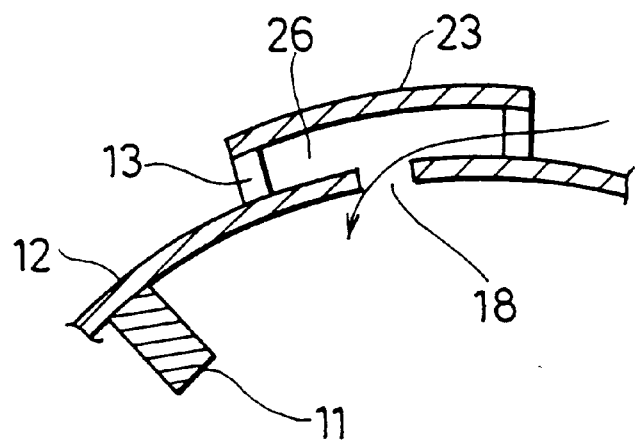
FIG. 6 is an enlarged fragmental view of the embodiment of FIG. 5.
Figure 7:
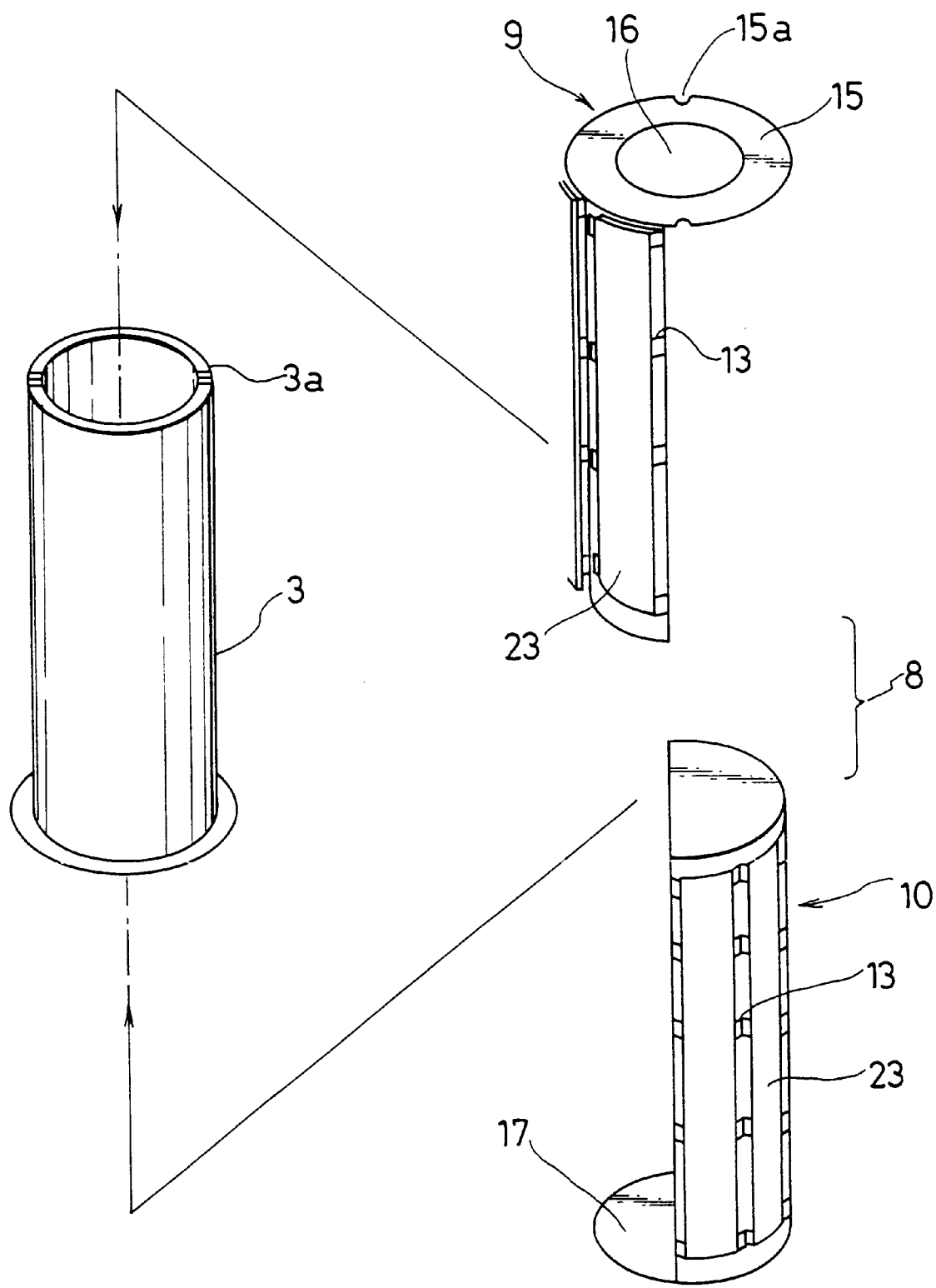
FIG. 7 is an exploded perspective view illustrating a boat cover mechanism of the separate embodiment.

Turning now to FIG. 4–FIG. 7, there is shown a boat cover similar to that shown in FIG. 13 and FIG. 14 but comprising a two-part separable type composes of a boat cover and a cover boat, to which the present invention is applied. In FIG. 4–FIG. 6, principal portions of the illustrated arrangement are the same as those shown in FIG. 13 and FIG. 14, and discussion thereof will therefore be omitted. Only different portions will be described below.

Auxiliary cover plate 14 of the boat cover 9 shown in FIG. 13 and FIG. 14 is replaced by an auxiliary cover plate 23 of larger width. By mounting the auxiliary cover plate 23, a reactive gas flow passage 26 is provided between the cover plate 12 and the auxiliary cover plate 23. As described above, reactive gas flowing in through slit gaps 18 is altered to a circumferential flow. By interference of the opposing gas flow from both edges of the auxiliary cover plate 23, the gas passed through the slit gaps 18 is diffused. Consequently, the gas concentration of the reactive gas in areas adjacent to the slit gaps 18 is prevented from rising excessively high locally.

Figure 8:
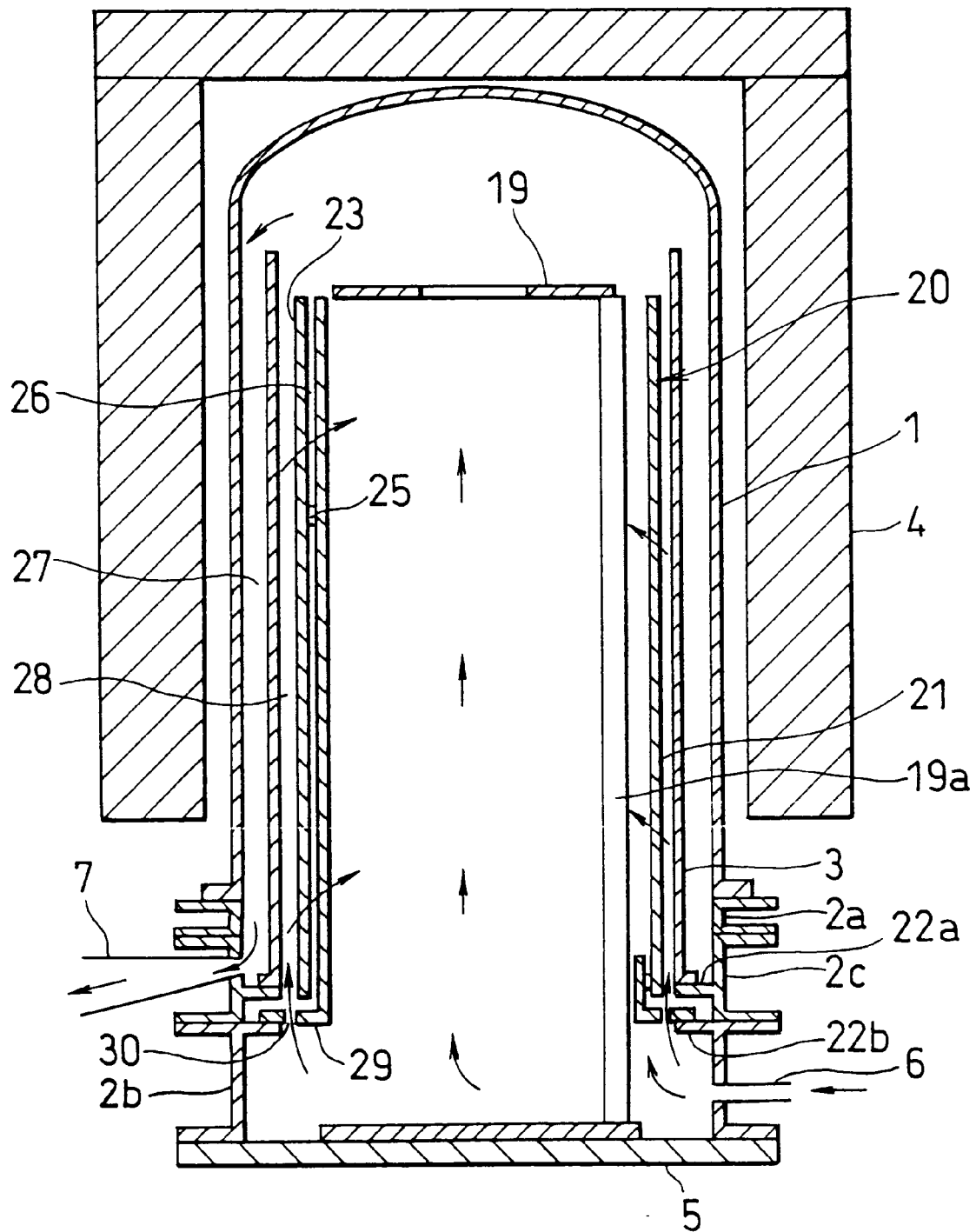
FIG. 8 is a vertical cross-sectional view schematically illustration an additional embodiment according to the present invention.

Referring to FIG. 8, an additional embodiment adapted to improve the positional precision and operability of the inner tube and boat cover will be described.

Flange disposed on a seal cap 5 can be separated into three pieces, namely, an upper flange 2a, an intermediate flange 2c and a lower flange 2b. The upper flange 2a, intermediate flange 2c and lower flange 2b are sequentially secured to the lower end of the outer tube 1. From the intermediate flange 2c, an inner brim 22a projects inwardly. By means of the inner brim 22a, the inner tube 3 is disposed vertically on the intermediate flange 2c. The exhaust nozzle 7 is provided in communication with the inner tube 3. On the upper end of the lower flange 2b, there is provided an inner brim 22b on which a boat cover 20 is disposed vertically. The exhaust nozzle 7 may instead be arranged to communicate with the upper flange 2a.

Figure 9:
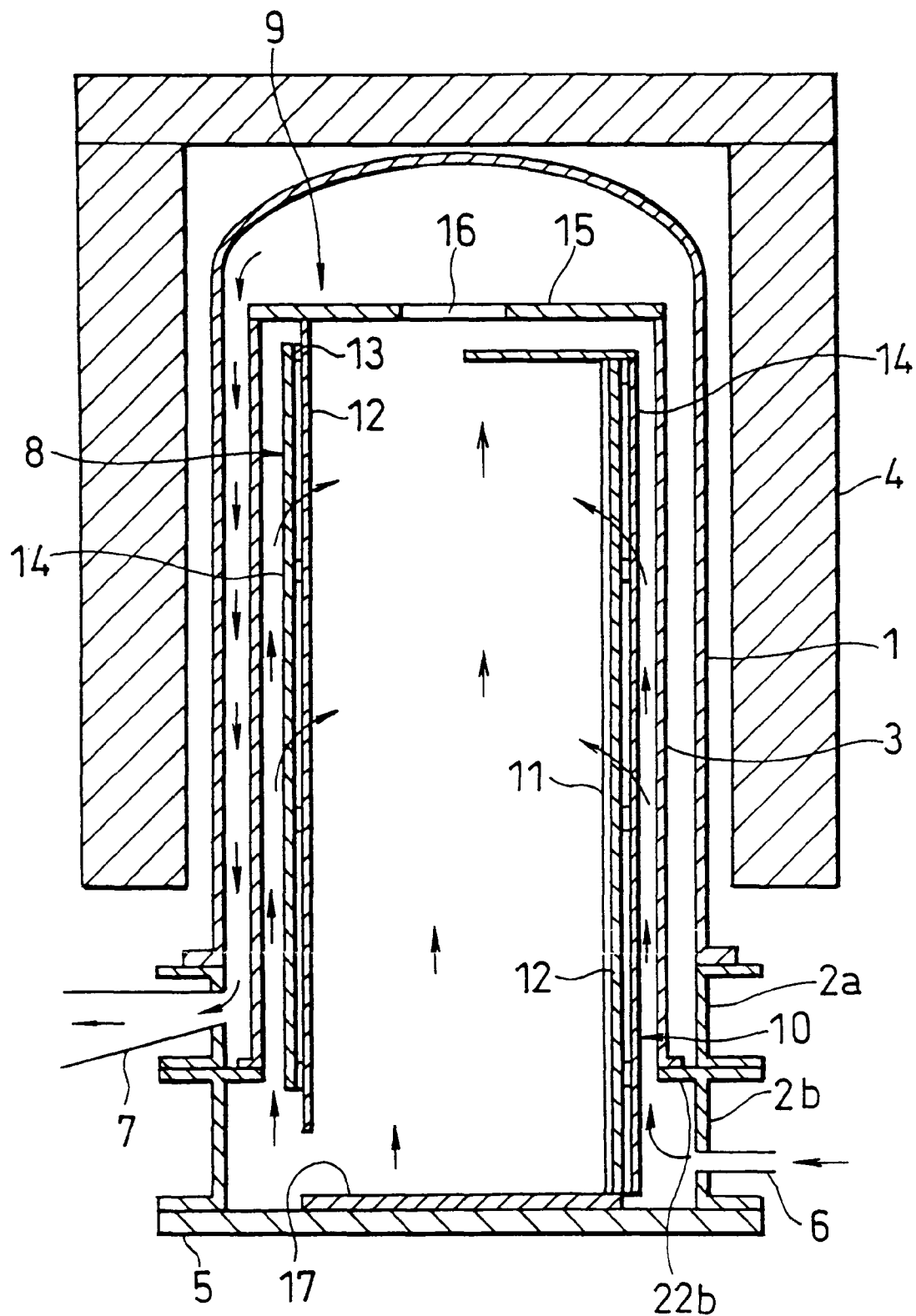
FIG. 9 is a vertical cross-sectional view schematically illustrating a further additional embodiment according to the present invention.

FIG. 9 illustrates a further additional arrangement in which a separable type flange is applied to the separable type cover boat 10 shown in FIGS. 4 to 7 to improve the positional precision and operability of the boat cover.

The flange disposed on the seal cap 5 can be separated into two parts, namely, an upper flange 2a and a lower flange 2b. On an upper end of the lower flange 2b, there is provided an inner brim 22b projecting centrally. Inner tube 3 is vertically disposed on the inner brim 22b. Exhaust nozzle 7 communicates with the upper flange 2a. Communicating with the lower flange 2b is an introducing nozzle 6.

In the embodiment being described, the inner tube 3 can be detached along with the lower flange 2b. Thus, maintenance works such as cleaning of the inner tube 3 can be performed separately from the exhaust nozzle 7 and an exhaust system connected to the nozzle 7.

Figure 12:
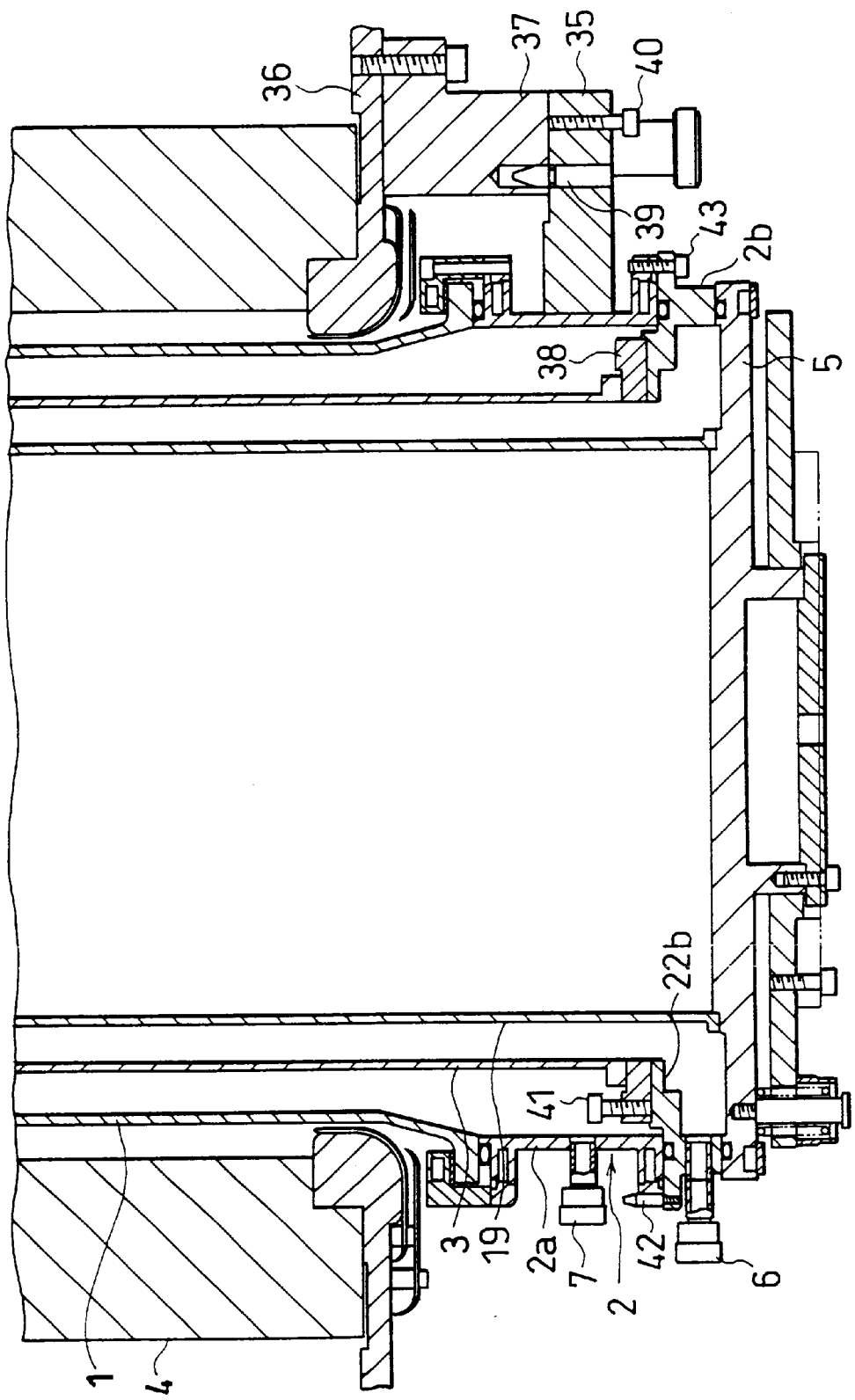
FIG. 12 is a cross-sectional view showing an embodiment of a separable type flange.

As shown in FIG. 12, the separable type flange can also be applied to a vertical furnace composed of the inner tube 3 and outer tube 1 without a boat cover.

In FIG. 12, the flange 2 is composed of an upper flange 2a and a lower flange 2b and thus separable into two. A bracket 35 extending horizontally is fixedly secured to the upper flange 2a. The bracket 35 is secured to an under surface of a heater base 36 by means of a block 37. On an upper end of the upper flange 2a, an outer tube 1 is vertically disposed. The lower flange 2b is secured to a lower end of the upper flange 2a. On the lower flange 2b, there is provided an inner brim 22b projecting centrally. Inner tube 3 is disposed on the inner brim 22b by means of a ring seat 38. A lower opened end of the lower flange 2b is covered by a seal cap 5 on which a boat 19 is vertically disposed.

Positioning of the bracket 35 relative to the block 37 is performed by a positioning pin 39. Position determination with respect to the upper flange 2a and centering of the outer tube 1 are performed by means of a plurality of push thread elements 41 in threaded engagement with the bracket 35, with the positioning pin 39 pulled out.

Centering of the inner tube 3 is carried out using the push thread elements 41 disposed in the ring seat 38. Positioning of the outer tube 1 and inner tube 3 is effected by means of the positioning pin 42 provided in the outer periphery of the inner brim 22b. Final fixing of the inner brim 22b is performed by a fixing thread element 43.

With this arrangement, it becomes possible to make adjustments of the outer tube 1 and inner tube 3 independently after assemblage of the latter, whereby adjustment operations and precision securing operations are simplified and work efficiency is increased.

Hereinafter, an implementation will be described.

The apparatus of FIG. 1 was used. The width of the slit aperture 24 is 6 mm. The boat cover 20 having the auxiliary cover plate 23 with a width of 30 mm was used. One hundred pieces of 8 inch wafers were loaded such that they were spaced apart from each other by 8.6 mm, with a space of 4.3 mm between the wafer edges and auxiliary cover plate 23. Through the introducing nozzle 6, 60 cc/min of $SiH_4$ gas and 3,000 cc/min of $N_2O$ gas were introduced. Inside the heater 4 was temperature controlled vertically in four different zones, at 797° C., 790° C., 780° C. and 791° C. from top to bottom. Inside the reaction chamber defined by the outer tube 1, upper flange 2a, lower flange 2b and seal cap 5 was maintained at 107 Pa by means of a vacuum exhaust pump (not shown) and a pressure controller (not shown), which are connected to the exhaust nozzle 7. Treatment lasted for 120 minutes.

Figure 10:
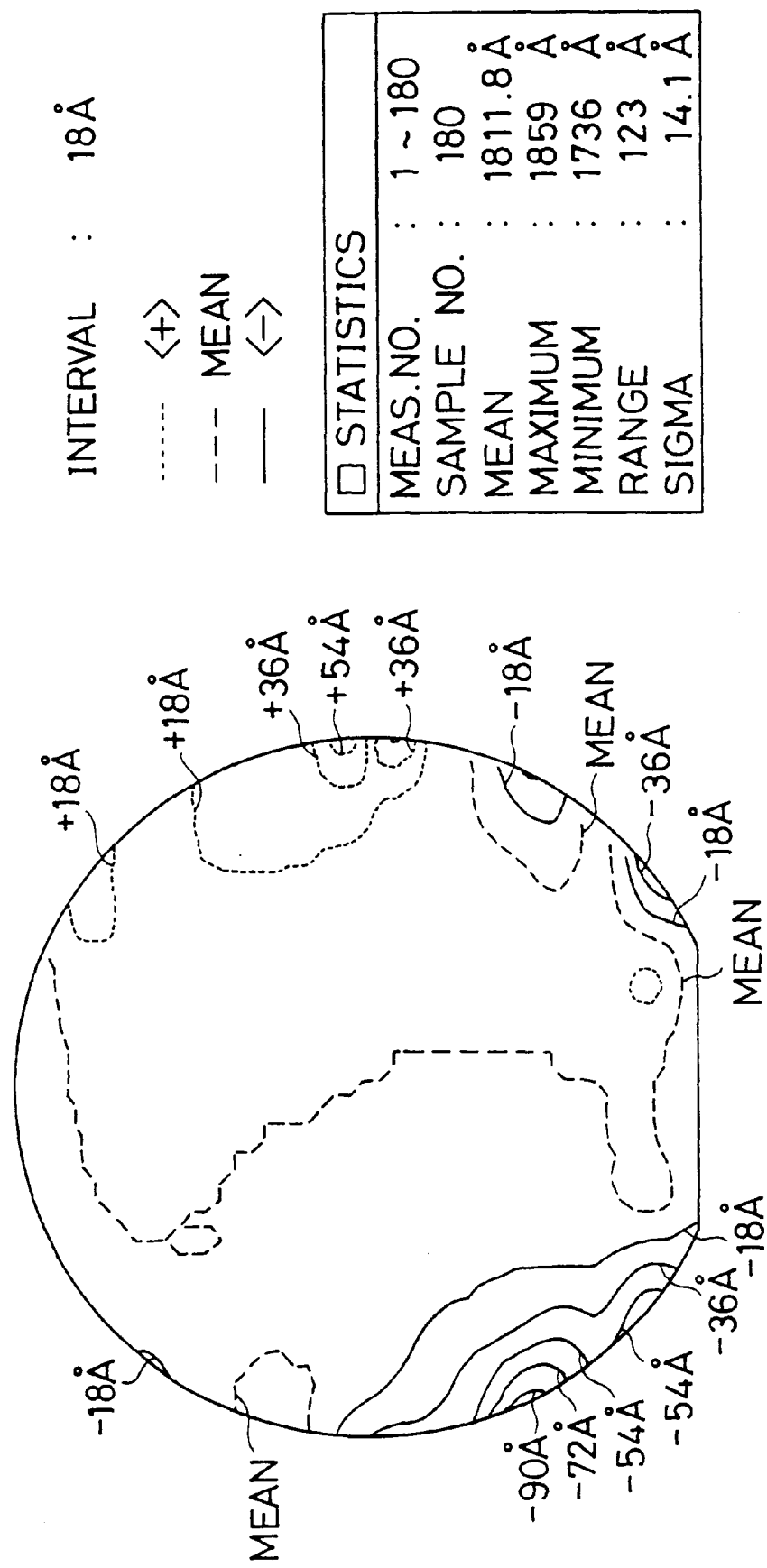
FIG. 10 is a wafer map illustrating the distribution of film thicknesses of wafers treated according to the present invention.

Film deposition results obtained at that time are shown in FIG. 10.

MEAN represents an average film thickness. In the figure, a wafer map is shown on which a contour-line is drawn each time deviation from the average film thickness becomes a multiple of a predetermined value of film thickness (INTERVAL value). In order to make clear distinction between the average value of film thickness and values larger or smaller than the average value, the average value of film thickness is shown by a coarse broken line while values larger and smaller than the average value are represented by a narrow broken line and a solid line, respectively. Thus, the values are represented by three different kinds of lines. SAMPLE NO. represents a value of measured film thickness of the wafer. Measured locations are scattered over the entire wafer surface at equal intervals. MAXIMUM and MINIMUM respectively represent a maximum value and a minimum value among all the measurements. RANGE represents a difference between the maximum and minimum values, that is, the maximum film thickness difference.

SIGMA represents a standard deviation which is obtained by the equation: $\sqrt{[\{\Sigma(x_i - x \text{ mean})^2\}/(n-1)]}$, where n is the number of film thickness measurements, $x_i$ is an "i"th (positive whole number) film thickness measurement, and "x mean" is an average value of film thickness.

RANGE is 123 Å. SIGMA is 14.1 Å.

For a comparative example, the apparatus of FIG. 1 was used. The slit apertures 24 and auxiliary cover plate 23 of a width of 6 mm were used. Other conditions were the same as in the above implementation. Wafer treatment was conducted in the same manner.

Figure 11:
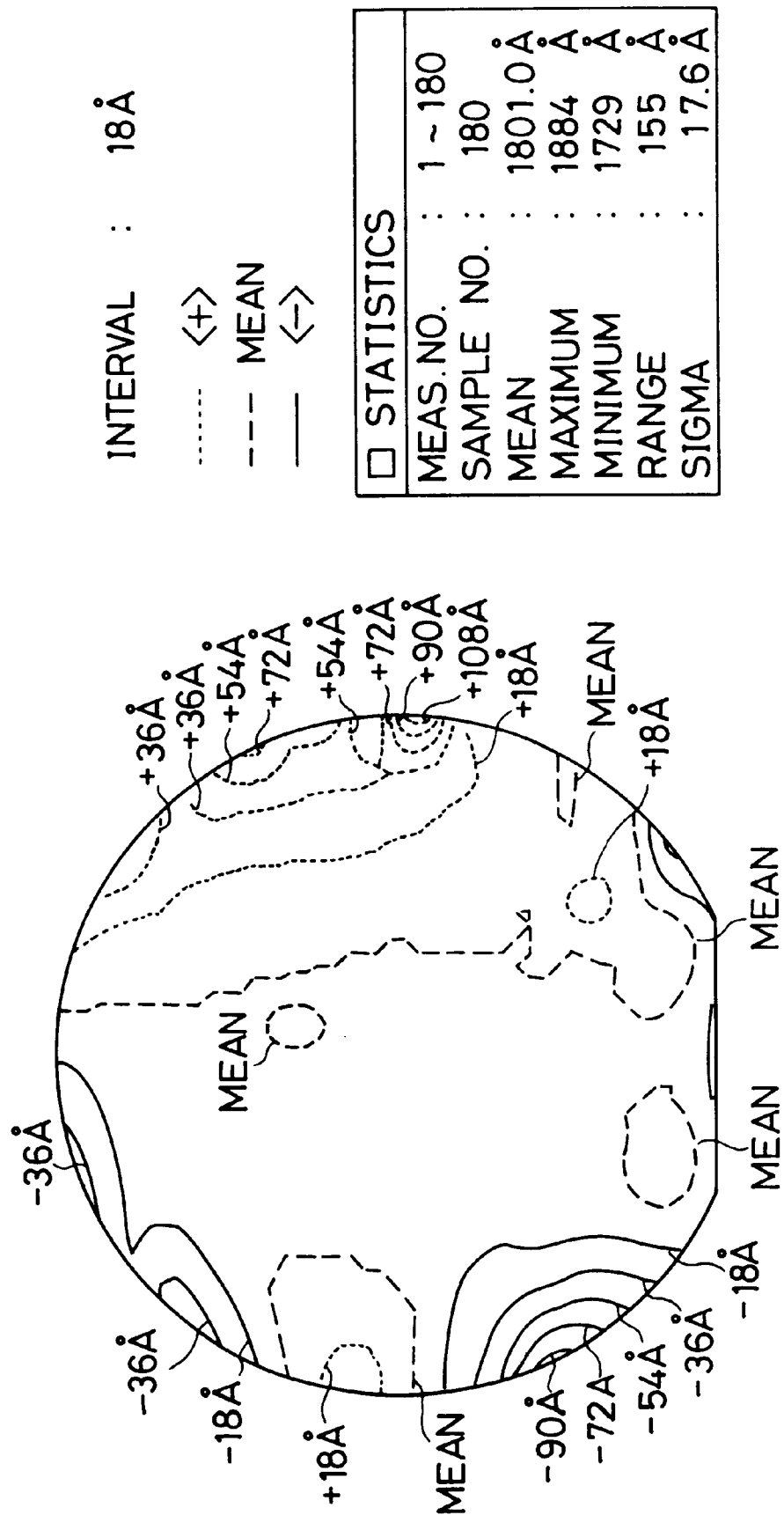
FIG. 11 is a wafer map illustrating the distribution of film thicknesses of wafers treated according to a conventional arrangement.

The results of the comparative example are shown in FIG. 11. As shown in the figure, RANGE was 155 Å, and SIGMA was 17.6 Å.

Comparison of the two examples reveals that there is a 32 Å drop in the RANGE (maximum film thickness difference) of the implementation relative to the comparative example, thus improving the uniformity of the film thickness. The standard deviation also dropped 3.5 Å, thus improving the uniformity of the film thickness distribution. Comparison between the film thickness distributions, shown by contour-lines, in areas adjacent to the slit apertures of FIG. 10 relative to the implementation and FIG. 11 relative to the comparative example reveals that the comparative example is influenced by the slit apertures in a wider range.

As thus far explained, the apparatus according to the present invention is comprised of a heater, an outer tube, an inner tube, and a boat cover, all being concentrically disposed in a multi-layered fashion for allowing introduction of wafers into the boat cover by means of a boat, wherein the boat cover has slit apertures covered by an auxiliary cover plate to thereby provide a gas flow passage between the boat cover and the auxiliary cover plate. With this arrangement, it becomes possible to improve the uniformity of the film thickness in areas adjacent to the slit apertures. It also becomes possible to improve the uniformity of the film thickness of wafers and homogeneity of the wafers and to suppress increase of exhaust conductance by narrowing the gap between the peripheral edges of the wafers and the tubular member enclosing the wafers. Further, it becomes possible to increase the number of wafers that can be loaded into the apparatus. By employing a boat cover of tubular configuration or a flange capable of being separated, positioning of the boat cover is rendered easy, whereby time required for assemblage and positional adjustments is significantly reduced, thus leading to improved throughput. Moreover, the apparatus is rendered excellent in re-assemblage or reproductivity and enables high precision positioning of the associated parts or members, thus improving the quality of the resulting products.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A vertical furnace for use in a semiconductor manufacturing apparatus, comprising: a heater, an outer tube, an inner tube, all being disposed concentrically in a multi-layered fashion; a boat adapted to be introduced into said inner tube with a wafer loaded thereon, and a boat cover disposed internally of said inner tube concentrically therewith, said boat cover comprising a boat cover body and auxiliary cover plates spaced apart by a given gap from said boat cover body, said boat cover body having a given number of slit apertures extending in a vertical direction thereof, said auxiliary cover plates being disposed to cover said slit apertures and being wider than said slit apertures to thereby provide a gas flow passage between said auxiliary cover plates and said boat cover body.

2. A vertical furnace for use in a semiconductor manufacturing apparatus, according to claim 1, wherein said boat cover has a tubular configuration.

3. A vertical furnace for use in a semiconductor manufacturing apparatus according to claim 2, wherein said boat has support posts for supporting wafers and said boat cover has escape portions provided at portions thereof corresponding to said support posts of said boat for accommodating said support posts.

4. A vertical furnace for use in a semiconductor manufacturing apparatus, according to claim 1, or 3, wherein a distance from an edge of said wafer to said boat cover is 1/3 to 2/3 of a vertical distance between two adjacent wafers.

5. A vertical furnace for use in a semiconductor manufacturing apparatus, according to claim 2, wherein said inner tube and said boat cover are opened at upper and lower ends thereof.

6. A vertical furnace for use in a semiconductor manufacturing apparatus, according to claim 5, wherein said boat is mounted in such manner that a ceiling plate is connected to a bottom plate by means of support posts having a wafer support groove, said ceiling plate having a dimension smaller than a diameter of the wafer.

7. A vertical furnace for use in a semiconductor manufacturing apparatus, according to claim 2, wherein an upper flange is connected to a lower end of said outer tube, a lower flange is connected to said upper flange, said inner tube is supported by said upper flange, and said boat cover is supported by said lower flange.

* * * * *

UNITED STATES PATENT AND TRADEMARK OFFICE
CERTIFICATE OF CORRECTION

PATENT NO. : 5,902,103  
DATED : May 11, 1999  
INVENTOR(S) : Kiyohiko Maeda et al.

Page 1 of 1

It is certified that error appears in the above-identified patent and that said Letters Patent is hereby corrected as shown below:

<u>Title page,</u>
Item [30], insert FOREIGN/PCT APPLICATIONS  
JAPAN         7/353215             12/29/95

Signed and Sealed this

Fifth Day of February, 2002

*Attest:*

*Attesting Officer*

JAMES E. ROGAN  
*Director of the United States Patent and Trademark Office*